United States Patent
Choy

(10) Patent No.: US 6,213,806 B1
(45) Date of Patent: Apr. 10, 2001

(54) IC SOCKET

(75) Inventor: Conrad Choy, San Fransisco, CA (US)

(73) Assignee: Enplas Corporation, Saitama-Ken (JP)

( * ) Notice: Subject to any disclaimer, the term of this patent is extended or adjusted under 35 U.S.C. 154(b) by 0 days.

(21) Appl. No.: 09/255,061

(22) Filed: Feb. 22, 1999

(30) Foreign Application Priority Data

Feb. 27, 1998 (JP) .................................................. 10-063999

(51) Int. Cl.[7] .................................................... H01R 13/62
(52) U.S. Cl. ............................................ 439/331; 439/73
(58) Field of Search ............................... 165/80.1, 80.2, 165/80.3; 439/331, 73, 330, 485, 487, 912; 324/765; 411/353, 517, 521

(56) References Cited

U.S. PATENT DOCUMENTS

| | | | |
|---|---|---|---|
| 4,113,397 | * | 9/1978 | Snyder .................................. 403/154 |
| 5,520,490 | * | 5/1996 | Perach et al. ......................... 411/353 |
| 5,651,688 | | 7/1997 | Lin ....................................... 439/331 |
| 5,807,104 | * | 9/1998 | Ikeya et al. ............................. 439/73 |
| 5,870,286 | * | 2/1999 | Butterbaugh et al. ............... 361/704 |
| 6,019,166 | * | 2/2000 | Viswanath et al. ................. 165/80.4 |

* cited by examiner

Primary Examiner—Gary Paumen
Assistant Examiner—Ross Gushi
(74) Attorney, Agent, or Firm—Fish & Richardson PC

(57) ABSTRACT

In an IC socket, a pressure cover is disposed to be rotatable so as to be opened or closed with respect to a socket body, so that when the pressure cover is closed, an IC package mounted on the socket body is pressed. The pressure cover is provided with a heat sink and a heat of the IC package is radiated therefrom through a press-contact of the heat sink to the IC package. The pressure cover is formed with a heat sink receiver on an inner surface side to the socket body so as to receive the heat sink and a holding member is disposed on an inner surface side of the pressure cover to be detachable so as to detachably hold the heat sink between the heat sink receiver and the holding member.

6 Claims, 15 Drawing Sheets

IC SOCKET

BACKGROUND OF THE INVENTION

1. Field of the Invention

The present invention relates to an IC socket for detachably holding an IC package, which is particularly provided with a heat sink, which can be easily exchanged, for discharging heat of the IC package.

2. Prior Art

A known IC socket of this type has a structure for holding an IC package for carrying out a performance test such as burn-in test of the IC package.

That is, in such IC socket, the IC package is mounted on a socket body, and the IC package is depressed from an upper side by rotating downward a pressure cover rotatably mounted to the socket body so that a number of terminals formed to the IC package come into contact to contact pins located to the socket body at a predetermined pressure.

Some kinds of such conventional IC sockets are provided with heat sinks for discharging (radiating) heat of the IC package in contact thereto. However, in such IC sockets, if the thickness of the IC package or the size of pressing surface of the heat sink are changed, a desirable press contacting cannot be ensured and a suitable heat radiation cannot be expected by using the same heat sink, thus providing a problem.

SUMMARY OF THE INVENTION

An object of the present invention is to substantially eliminate such defects or problems as mentioned above in the prior art and to provide an IC socket in which, even if the thickness of an IC package or a size of a pressing surface of a heat sink is changed, one socket body can be commonly used and the heat sink can be easily exchanged with another one corresponding to an IC package to be used.

This and other object can be achieved according to the present invention by providing, in one aspect, an IC socket in which a pressure cover is disposed to be opened and closed with respect to a socket body so that when the pressure cover is closed, an IC package mounted on the socket body is pressed, the pressure cover being provided with a heat sink, and a heat of the IC package is radiated therefrom through a press-contact of the heat sink to the IC package, and wherein the pressure cover is formed with a heat sink receiver on an inner surface side to the socket body so as to receive the heat sink and a holding member is disposed on an inner surface side of the pressure cover to be detachable so as to detachably hold the heat sink between the heat sink receiver and the holding member.

In another aspect, there is provided an IC socket comprising:

a socket body provided with a plurality of contact pins;

an IC package mounted to the socket body and provided with a plurality of terminals to be contacted to the contact pins;

a pressure cover attached to the socket body to be rotatable so as to be opened or closed;

a heat sink mounted to the pressure cover so that when the pressure cover is rotated to be closed, a heat is radiated from the IC package through a contact of the heat sink to the IC package;

a heat sink receiver formed to an inner surface side of the pressure cover on the socket body side and adapted to receive therein the heat sink; and a holding member mounted to an inner surface side of the pressure cover to be detachable, the heat sink being held to be detachably between the heat sink receiver and the holding member.

In preferred embodiments in these aspects, the holding member has a structure commonly acting as an IC package pressing means when the pressure cover is closed.

The holding means is provided with a pin projecting toward the pressure cover, the pressure cover is formed with a through hole through which the pin penetrate, the pin having a front end projecting over the through hole, and the projected end of the pin is fixed by a fallout prevention means formed on an outer surface side of the pressure cover. The fallout prevention means comprises lock shim means engageable with the front end of the pin. A pair of pins are located, each of the projected front end of the pins being formed with an engaging groove and the lock shim means comprises a single lock shim member being composed of a pair of engaging pieces and an operation piece connecting both the engaging pieces, each of the engaging pieces being formed with a slot with which the engaging groove of the pin is engaged. The lock shim means may comprise a pair of lock shim members each having an engaging piece and an operation piece, the engaging piece being formed with a slot with which the engaging groove of the pin is engaged.

The pin comprises a front end portion formed as a head portion and a shank portion continuous to the head portion, the shank portion being formed with a slit extending along an axial direction thereof and also formed with a staged portion having a diameter smaller than that of the front end portion, the staged portion being engaged with a peripheral edge of the through hole of the pressure cover.

At least one of the holding member and the pressure cover is provided with an elastically deformable engaging piece and another one thereof is formed with a portion to be detachably engaged with the engaging piece so as to lock the holding member to the pressure cover when engaged.

The heat sink is composed of a plate member having one surface formed with a protruded portion abutting against the IC package and another surface formed with a plurality of heat radiating projections which are fitted into a plurality of holes formed to the heat sink receiver. A coil spring may be disposed between the heat sink and the heat sink receiver so as to urge the heat sink toward the holding member.

According to the IC socket of the present invention of the characters mentioned above, since the heat sink is held to be detachable between the heat sink receiver of the pressure cover and the holding member, the heat sink can be easily exchanged simply by detaching the holding member.

Furthermore, since the holding member also functions as a pressing member for the IC package when the pressure cover is closed, number of parts to be located can be eliminated.

Still furthermore, the holding means is provided with a pin projecting toward the pressure cover, the pressure cover is formed with a through hole through which the pin penetrate, the pin having a front end projecting over the through hole, and the projected end of the pin is fixed by a fallout prevention means formed on an outer surface side of the pressure cover. Accordingly, the location of the fallout prevention means permits the holding member to be detached or attached on the outer surface side of the pressure cover. Moreover, since the fallout prevention means comprises lock shim means engageable with the front end of the pin, the lock shim means and the pin can be easily mounted or dismounted.

Still furthermore, at least one of the holding member and the pressure cover is provided with an elastically deformable engaging piece and another one thereof is formed with a portion to be detachably engaged with the engaging piece so as to lock the holding member to the pressure cover when engaged. This structure makes it possible to attach or detach the holding member to or from the pressure cover by, so-called, one-touch operation.

The nature and further characteristic features will be made more clear from the following descriptions made with reference to the accompanying drawings.

BRIEF DESCRIPTION OF THE DRAWINGS

In the accompanying drawings:

FIG. 6 includes FIGS. 6A, 6B and 6C showing a cam member of the IC socket, in which

FIG. 7 includes FIGS. 7A and 7B showing a lever member of the IC socket, in which

FIG. 8 includes FIGS. 8A and 8B showing an operation of the IC socket of the present invention, in which

FIG. 13 includes FIGS. 13A and 13B showing a lock shim according to a second embodiment of the present invention, in which

FIG. 14 includes FIG. 14A and FIG. 14B showing a pin and its associated members according to a third embodiment of the present invention, in which

DESCRIPTION OF THE PREFERRED EMBODIMENTS

The IC socket according to the present invention will be described hereunder with reference to preferred embodiments shown in the accompanying drawings.

[First Embodiment]

Figure 10:
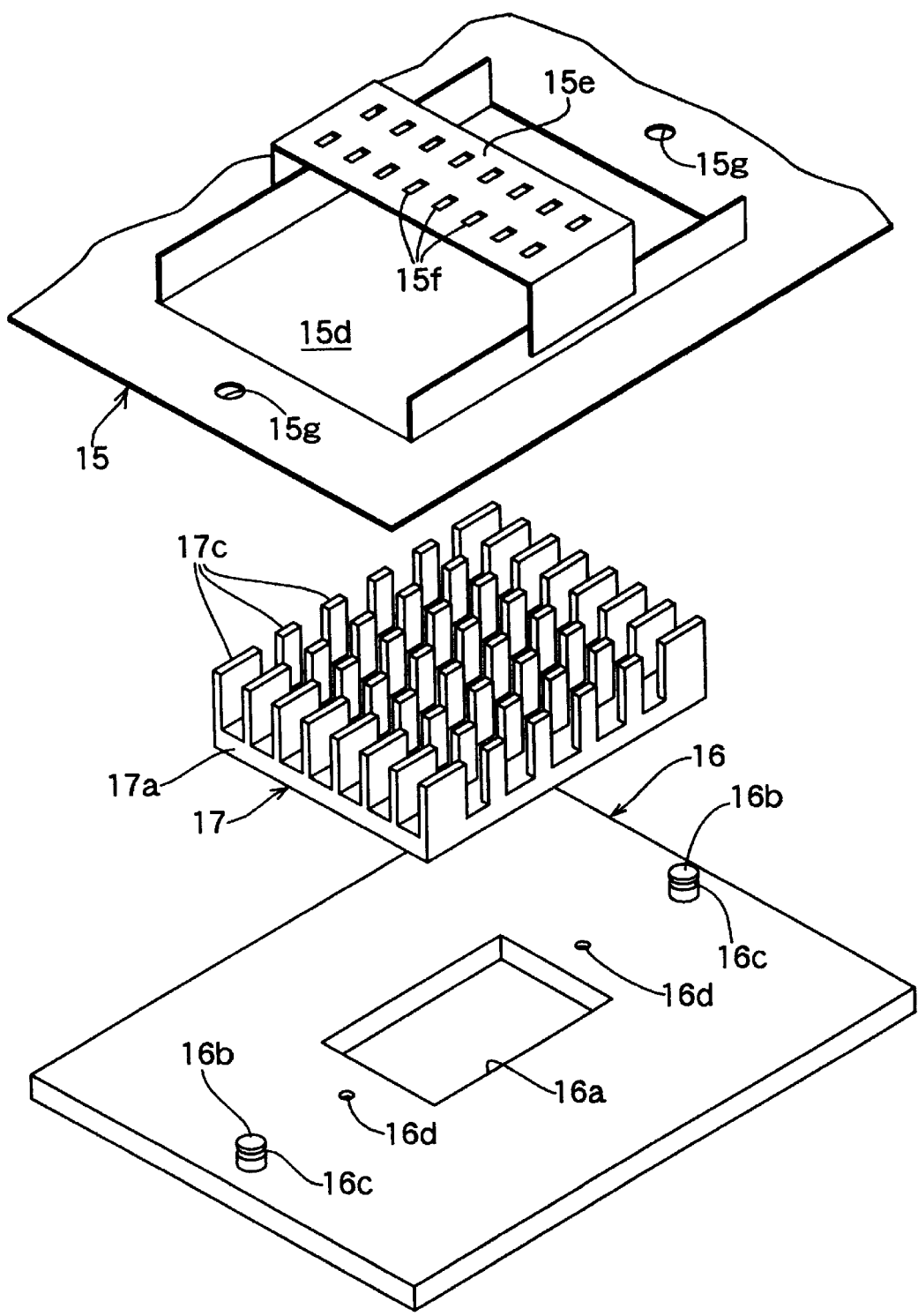
FIG. 10 is a developed perspective view of a holding member, a heat sink and a pressure cover of the IC socket of the present invention.
Figure 11:
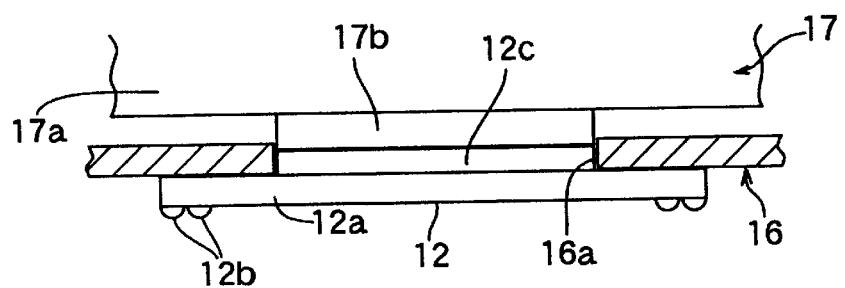
FIG. 11 is a sectional view showing a state that the holding member and the heat sink abut against the IC package.

FIGS. 1 to 12 represent a first embodiment of an IC socket of the present invention, in which the IC socket is denoted by the reference numeral 11. The IC socket 11, as shown in FIG. 11, detachably holds an IC package 12 and is adapted to electrically connect terminals 12b of the IC package 12 to a printed circuit board, not shown, of a tester for carrying out a performance test of the IC package 12.

The IC package 12 is provided with a package body 12a having a lower surface, as viewed in FIG. 11, and a number of terminals 12b, each in shape of ball, project downward from a peripheral portion of the lower surface. A heat radiating portion 12c is formed to an upper portion of the package body 12a so as to protrude upward.

The IC socket 11 generally comprises a socket body 13, a pressure cover 15, a holding member 16 and a heat sink 17. The IC package 12 is mounted to the socket body 13, the pressure cover 15 is rotatably mounted to the socket cover 13 through a rotating shaft or pivot pin 14, and the holding member 16 attached to the pressure cover 15 so that when the pressure cover 15 is rotated downward in the state shown in FIG. 11, the IC package 12 mounted to the socket body 13 is depressed from the upper side and, then, the heat sink 17 attached to the holding member 16 abuts against the IC package 12 so as to radiate the heat of the IC package 12.

In more detail, the socket body 13 is formed with a recessed portion 13a having a rectangular shape, the recessed portion 13a has a bottom portion 13b to which are formed a number of through holes 13c into which contact pins 18 located to the socket body 13 are inserted, respectively. The contact pin 18 is formed of a material having an electrically conductive property. The contact pin 18 has an upper end portion 18a inserted into an insertion hole 20a of a floating plate 20 and secured thereto and also has an intermediate portion to which an elastically deformable spring portion 18b is formed. The terminals 12b of the IC package 12 abut against the upper end portions 18a of the contact pin 18, respectively.

The reference numeral 21 denotes a location board formed with insertion holes 21a into which lower end portions of the contact pins 18 are inserted in a state to be movable in a vertical direction.

Figure 5:
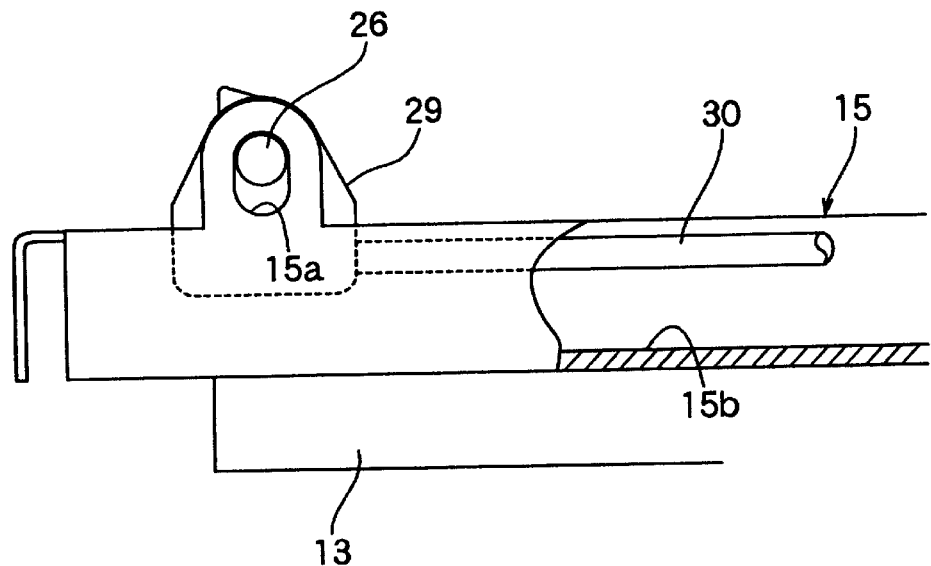
FIG. 5 is a side view showing a connecting portion of the pressure cover and a support shaft.
Figure 6A:
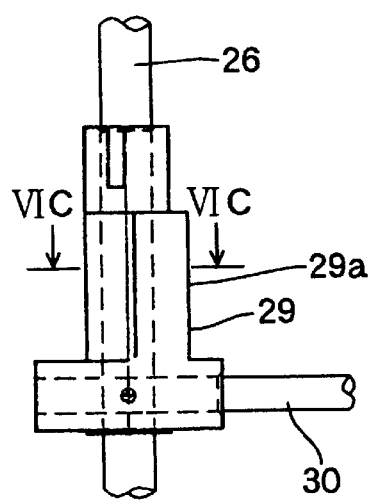
FIG. 6A is a plan view of the cam member and its associated members.
Figure 6B:
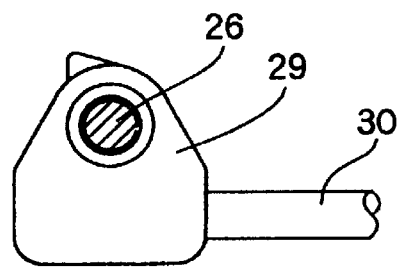
FIG. 6B is a front view of the cam member and FIG. 6C is a sectional view taken along the line VIC—VIC in FIG. 6A.
Figure 6C:
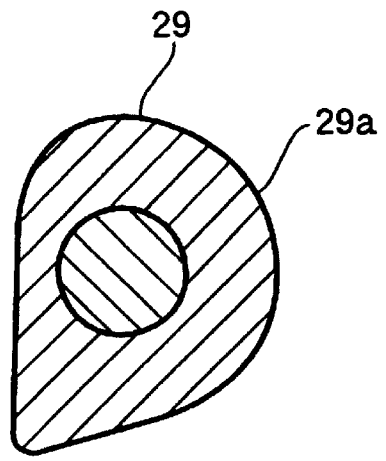
Figure 7A:
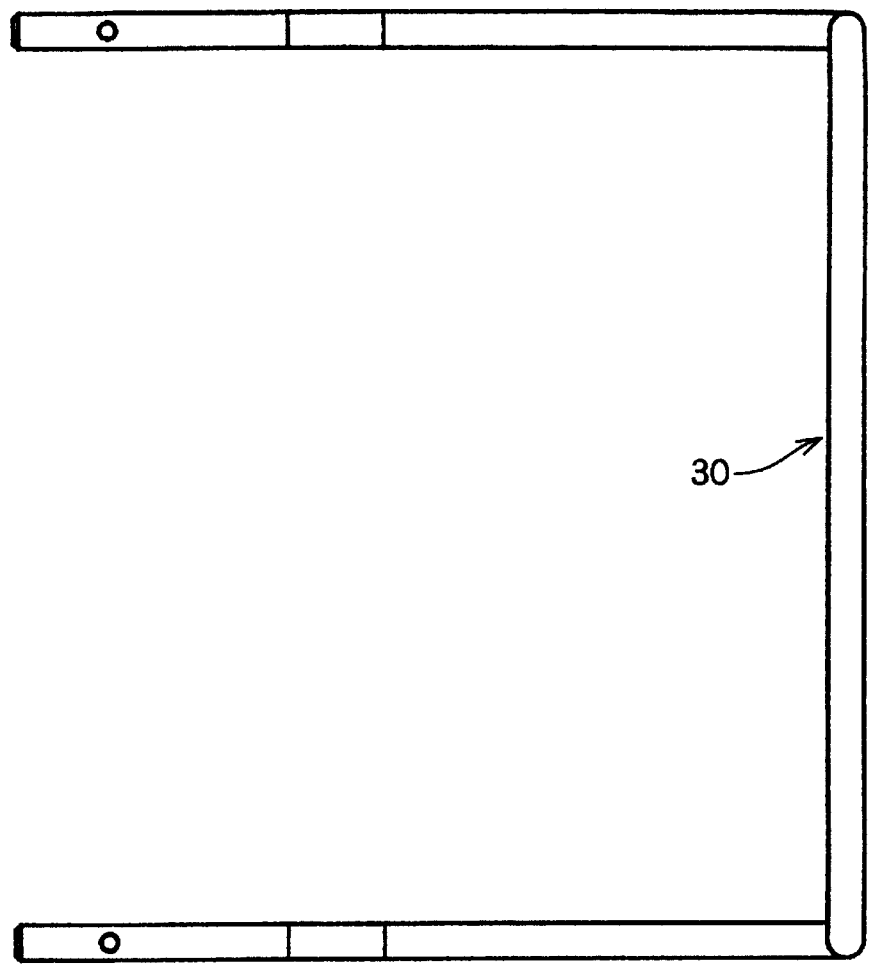
FIG. 7A is a plan view of the lever member and FIG. 7B is a front view thereof.
Figure 7B:
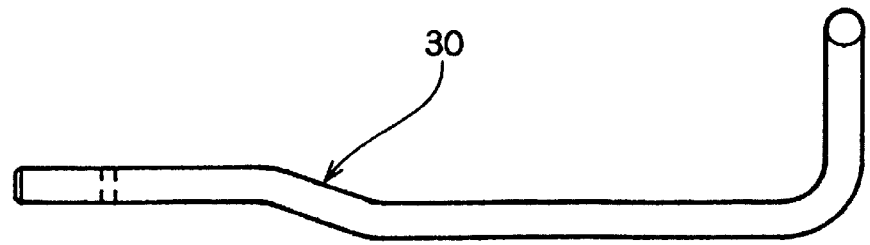

The pressure cover 15 has a base end portion rotatably mounted to the socket body 13 through the pivot pin 14 and is urged by a spring 23 in a direction for opening the cover 15. The pressure cover 15 also has a front end portion at which a stopper member 25 acting as a stopper means is supported by a support shaft or pin 26, which is idly inserted into a slot 15a formed to the cover 15 to be movable in a vertical direction, as shown in FIG. 5, i.e. in a tangential direction of a circle with the pivot pin 14 being the center of the circle. The stopper member 25 is urged by a spring 27 in a counterclockwise direction in FIG. 1 to thereby be engaged with a stopper member engaging portion 13d formed to the socket body 13.

Figure 1:
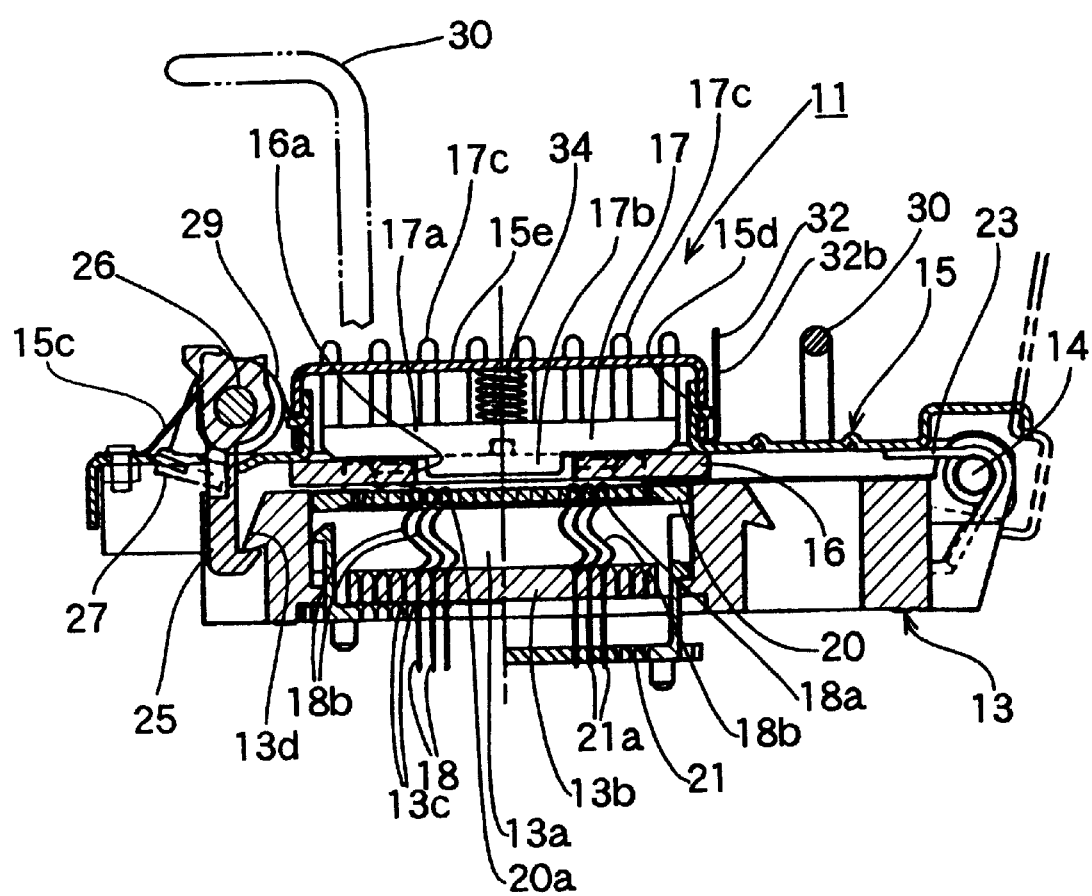
FIG. 1 is a sectional view of an IC socket according to a first embodiment of the present invention taken along the line I—I in FIG. 2, latter mentioned.
Figure 2:
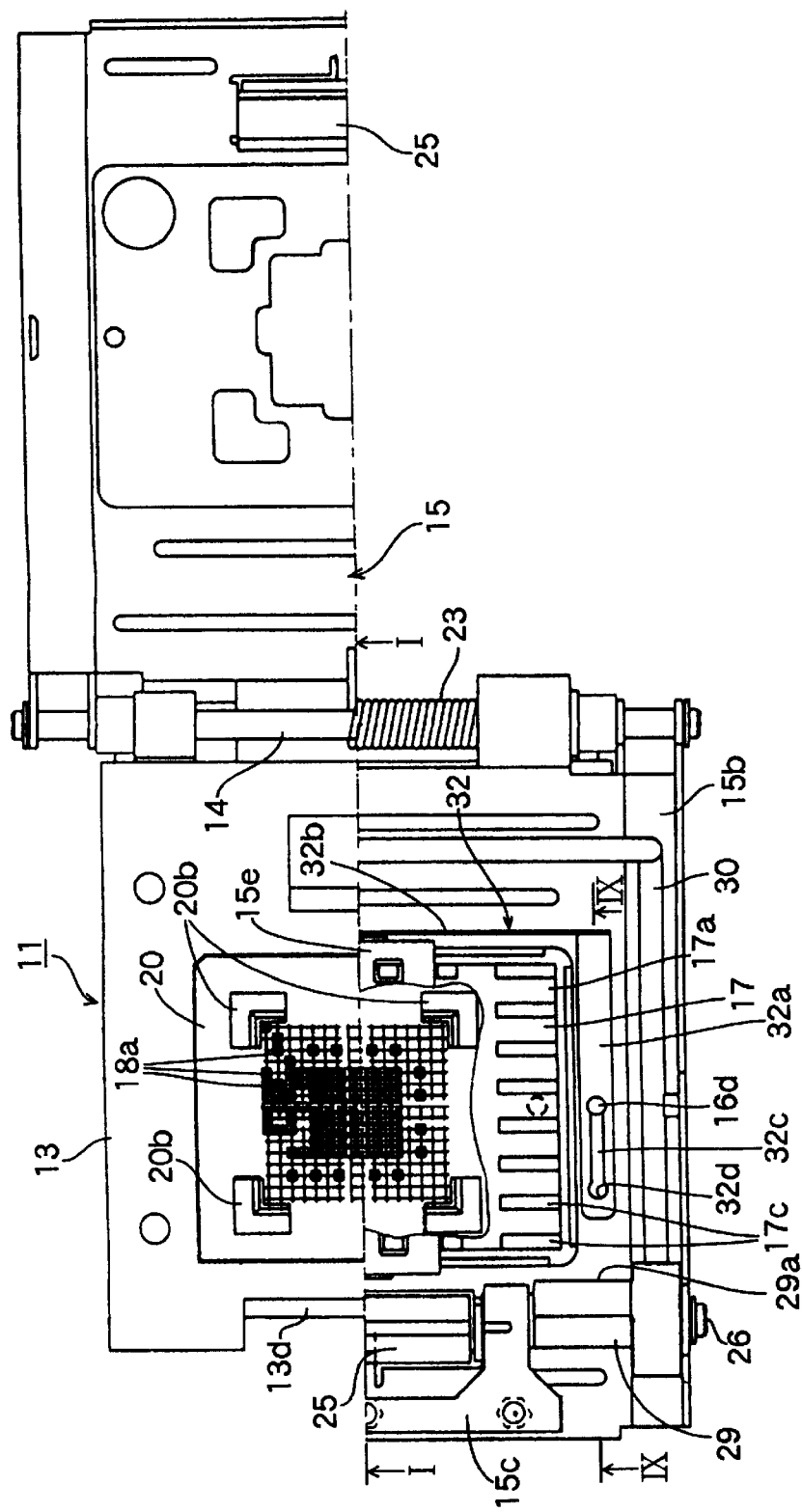
FIG. 2 is a plan view of the IC socket.

Further, as shown in FIG. 1 or 2, the support shaft 26 is always urged toward the pressure cover 15 (downward direction in FIG. 1) by a leaf spring 15c provided for the cover 15. A proximity means is also disposed for further approaching the pressure cover 15 toward the socket body 13 from the engaging state mentioned above. The proximity means is disposed to the support shaft 26 so that a cam member 29 is freely rotatable. A pair of cam members 29 are disposed on both longitudinal side ends of the support shaft 26 and lever members 30, each having substantially a ⊐-shape, are connected to the cam members 29, respectively. The cam members 29 have cam surfaces 29a which contact to the upper surface of the pressure cover 15 in a slidable manner, and when the lever members 30 are rotated, the cam surfaces 29a slide along the upper surface of the pressure cover 15 and the pressure cover 15 therefore further approaches towards the socket body side.

The pressure cover 15 is, as shown in FIG. 10, further formed with an opening 15d at substantially the central portion thereof and a heat sink receiver 15e (heat sink receiving recess) having substantially a ⊐-shape is formed to the opening 15d, the heat sink receiver 15e being formed with a plurality of insertion openings 15f.

The heat sink 17 is disposed in the heat sink receiver 15e in the opening 15d to an inner surface side on the socket body side 15. As shown in FIG. 1, for example, the heat sink 17 is provided with a plate portion 17a, a protruded portion 17b formed to the lower surface of the plate portion 17a so as to abut against the heat radiating portion 12c of the IC package 12, and a plurality of radiation projections 17c formed to the upper surface of the plate portion 17a so as to project upward. The radiation projections 17c are inserted into the insertion openings 15f formed to the heat sink receiver 15e, respectively.

The holding member 16 provides, as shown in FIG. 10, a rectangular plate-like shape, having a central portion at which is formed an opening 16a into which the protruded portion 17b of the heat sink 17 is inserted. A pair of pins 16b are formed on both sides of the opening 16a so as to project upward, and these pins 16b are inserted into through holes 15g formed to the pressure cover 15. Engaging grooves 16c are formed to the distal end portions of the pins 16 projecting over the through holes 15g and lock shims 32 as fallout prevention means formed on outer surface sides of the pressure cover 15 are detachably engaged with the engaging grooves 16c.

Figure 12A:
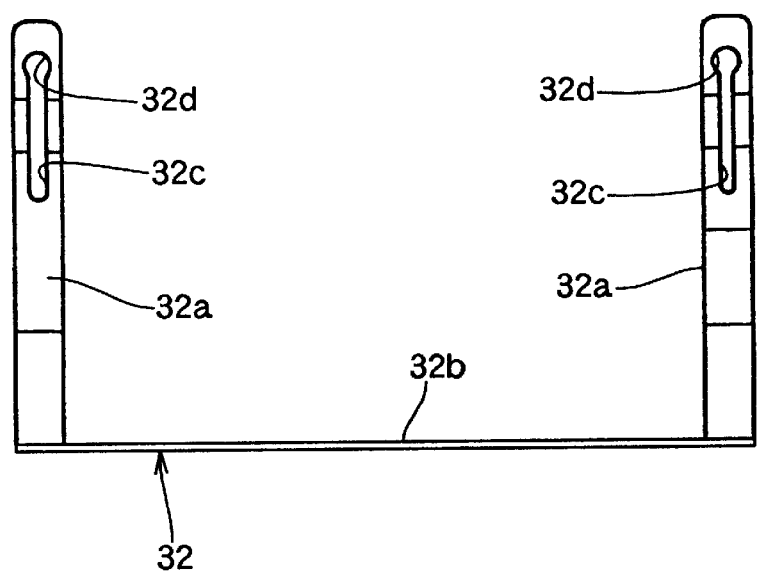
FIG. 12 includes FIGS. 12A, 12B and 12C, which are plan view, left side view and front view of a lock shim of the IC socket, respectively.
Figure 12B:
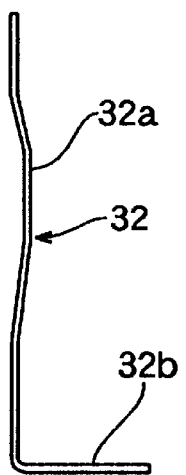
Figure 12C:
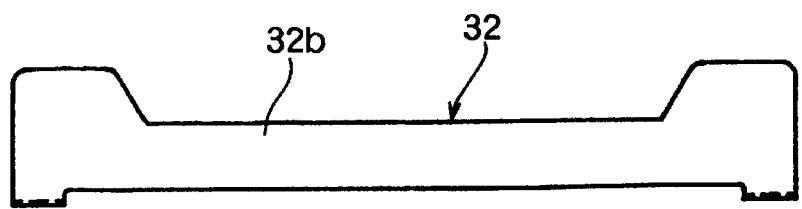

The lock shim 32 has substantially a ⊐-shaped structure, as shown in FIGS. 12A to 12C, having a pair of engaging pieces 32a and an operation piece 32b connecting the engaging pieces 32a, and slits 32c are formed to the respective engaging pieces 32a. Each of the slits 32c has a wide portion 32d having a size capable of inserting the pin 16b and has the other portion having a size smaller, narrower, than that of the wide portion 32d, capable of being engaged with the engaging groove 16c of the pin 16b to thereby prevent the fallout of the pin 16b and ensure the fixed state.

Figure 3:
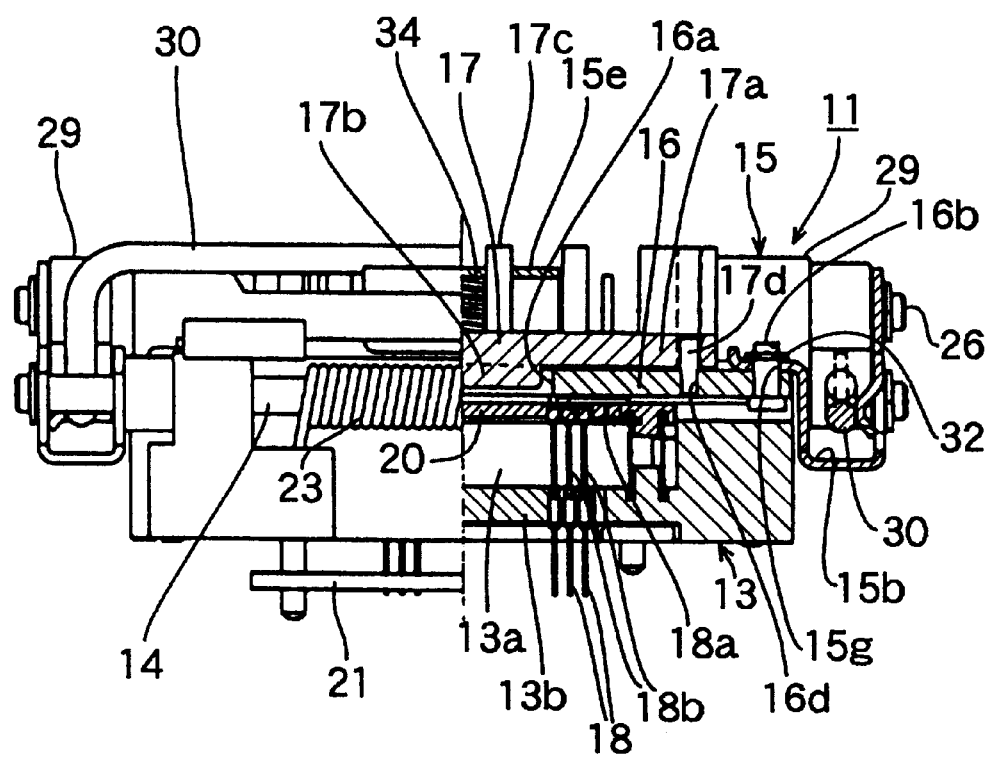
FIG. 3 is a right side view, half in section, of the IC socket.
Figure 4:
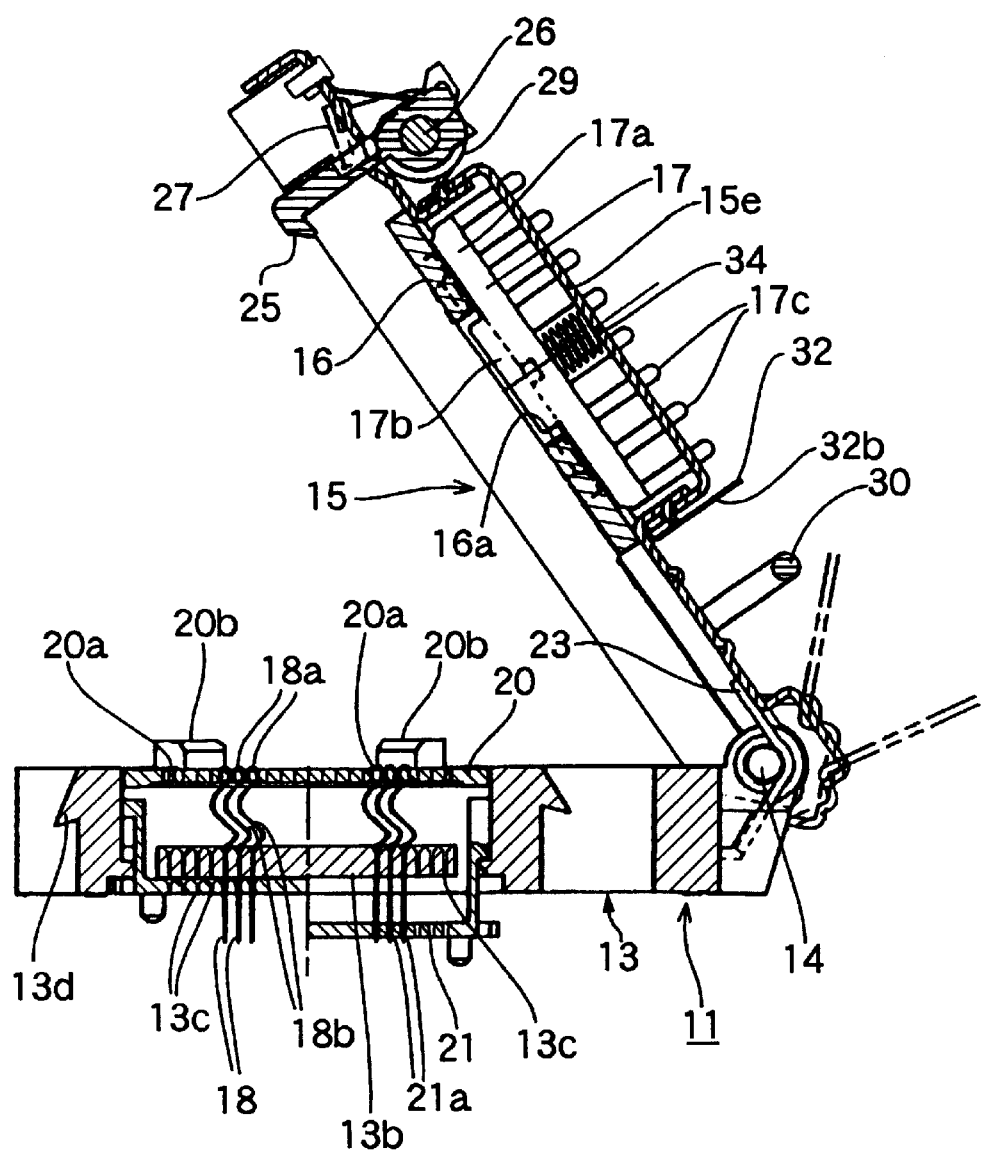
FIG. 4 is a sectional view of the IC socket with a pressure cover being opened.

Furthermore, as shown in FIG. 3, the heat sink 17 is formed with a plurality of positioning pins 17c so as to project downward, and the positioning pins 17c are fitted to engaging holes 16d formed to the holding member 16 to thereby establish the positioning of the heat sink 17.

Still furthermore, a coil spring 34 is disposed between the plate portion 17a of the heat sink 17 and the heat sink receiver 15e of the pressure cover 15 to urge downward the heat sink 17.

According to this structure, the heat sink 17 can be clamped between the heat sink receiver 15e and the holding member 16 in the detachable manner.

The IC package 12 is held by the IC socket 11 of the structure mentioned above in the following manner.

First, under the state of opening the pressure cover 15, the IC package 12 is mounted to a predetermined position on the floating plate 20 while guiding the IC package 12 by the guide projections 20b. Under this state, as the pressure cover 15 closes, the stopper member 25 is first engaged with the stopper member engaging portion 13d of the socket body 13 in a covering manner, and in this position, the lever member 30 stands upward.

Figure 8A:
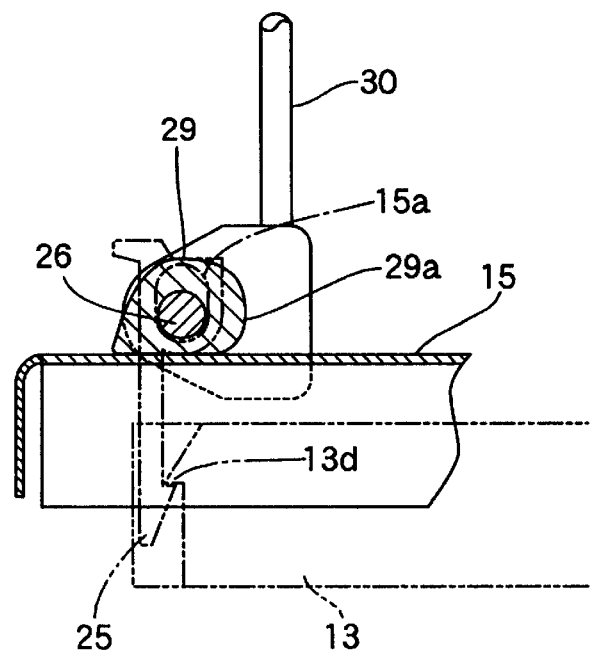
FIG. 8A is a view showing the lever member which is raised and FIG. 8B is a view showing the lever member which is brought down.
Figure 8B:
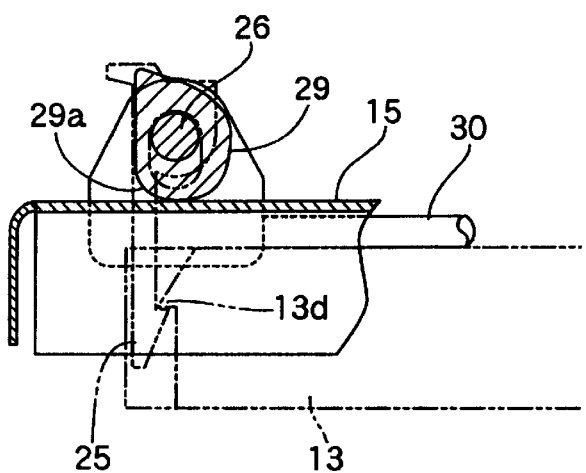
Figure 9:
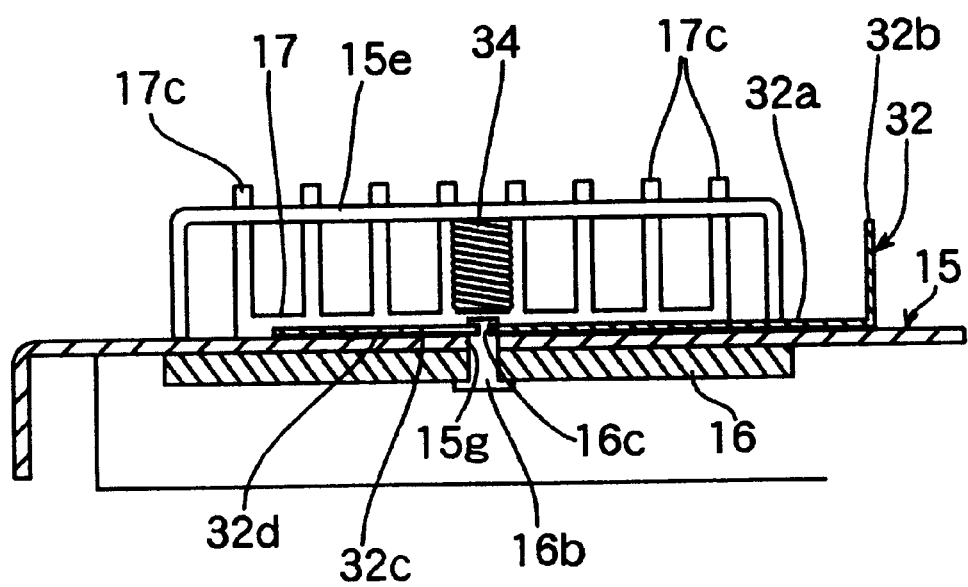
FIG. 9 is a sectional view of the IC socket of the present invention taken along the line IX—IX in FIG. 2.

Then, when the lever member 30 is rotated in the clockwise direction as shown in FIGS. 8A and 8B, the stopper member 25 is urged by the spring 27, the cam member 29 is rotated about the support pin 26 with the stopper member 25 being engaged with the engaging portion 13d, and the cam surface 29a of the cam member 29 slides on the upper surface of the pressure cover 15. Accordingly, since the stopper member 25 is engaged with the engaging portion 13d, the position of the support pin 26 is not changed and the support pin 26 is movable in the tangential direction of a circle with the rotational shaft 14 being the center thereof with respect to the pressure cover 15, so that the upper surface of the cover 15 is separated downward from the support pin 26, whereby the pressure cover 15 is depressed and rotated so as to approach the socket body side.

According to the operation mentioned above, the IC package body 12a is pressed with a predetermined force by the holding member 16 attached to the pressure cover 15, thereby bring the terminals 12b of the IC package 12 into contact to the upper end portions 18a of the contact pins 18.

In order to prevent damage of the terminals 12b of the IC package 12 at the time of contacting the contact pins 18, the spring portion 18b of the contact pin 18 has a deformable structure and when this portion 18b deformed at the time of contacting, the floating plate 20 is urged downward to thereby prevent an excessive contacting pressure from being applied.

Furthermore, at this contacting time, the recessed portion 17b of the heat sink 17 contacts, through surface-to-surface contact, the heat radiation portion 12c of the IC package 12 so as to release the heat of the IC package through the contact of the heat radiating projections 17c. Under such contacting state, the heat sink 17 is slightly deformed upward against the urging force of the coil spring 34 so as to form a gap between the heat sink 17 and the holding member 16 as shown in FIG. 11.

Further, when it is required to take out the IC package which has been held by the manner mentioned above, a manner reverse to that mentioned above may be adopted in which the lever member 30 is first rotated to its standing position to loosen the engaging condition of the stopper member 25 and the stopper member engaging portion 13d. In the next step, the stopper member 25 is rotated against the urging force of the spring 27 to thereby release the engaging condition thereof and then to open the pressure cover 15 by the urging force of the spring 23. In this state, the IC package 12 can be taken out.

As mentioned above, according to the structure of the present invention, the pressing force of the IC package 12 can be further improved more than in the engaging state of the stopper member 25 by utilizing a principle of lever caused by rotating the cam member 29 by means of the lever member 30. Accordingly, the contact between the terminals 12b of the IC package 12 and the upper end portions 18a of the contact pins 18 can be further ensured.

Incidentally, when it is required to hold or mount an IC package 12 having thickness and/or size different from that of the IC package 12 now mounted, the heat sink 17 now mounted is exchanged with new one having a structure corresponding to the IC package to be newly held. That is, under the pressure cover 15 being opened, the operation piece 32b of the lock shim 32 will be slid in a direction of the rotating shaft 14 in FIG. 2, and then, the pins 16b of the holding member 16 are moved to the position of the insertion portion 32d of the slit 32c of the lock shim 32. According to this operation, the pins 16b of the holding member 16 can be withdrawn from the through holes 15g of the cover 15, thereby taking out the heat sink 17 and the holding member 16 to a portion inside (socket body 13 side) of the pressure cover 15.

The new heat sink 17 will be mounted by the manner reverse to that mentioned above.

As mentioned above, the heat sink 17 can be exchanged easily only through the attaching or detaching of the holding member 16 by detachably holding or clamping the heat sink 17 between the heat sink receiving portion 15e and the holding member 16.

Moreover, since the attaching and detaching operations of the holding member 16 can be done on the outer surface side of the pressure cover 15 by operating the lock shim 32, these operations can be easily and smoothly performed.

Furthermore, since the holding member 16 also attains the function of pressing the heat sink 17 and pressing the IC package 12, additional parts for attaining such function can be prevented from being further located.

[Second Embodiment]

Figure 13A:
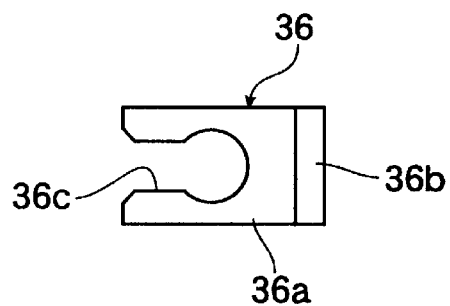
FIG. 13A is a plan view thereof and FIG. 13B is a sectional view showing a using state thereof.
Figure 13B:
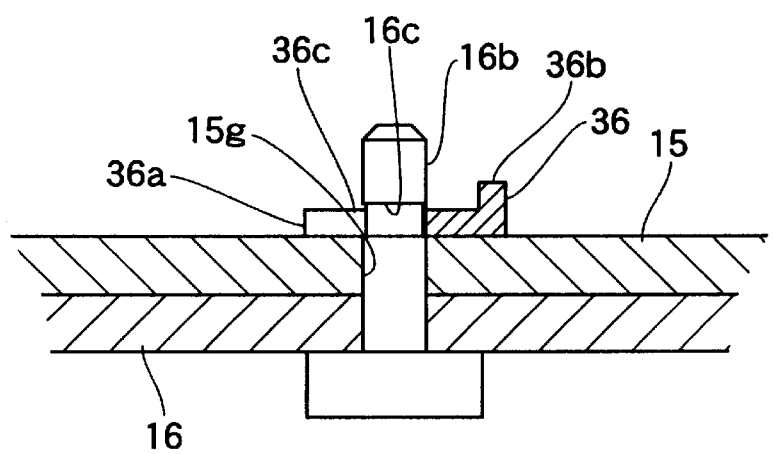

FIGS. 13A and 13B represent a second embodiment of the present invention, in which a structure of a lock shim 36 differs from the structure of the lock shim 32 of the first embodiment mentioned above.

That is, in the first embodiment, one large lock shim 32 is used for a pair of pins 16b, but one small lock shim 36 is disposed for each of the pins 16b, respectively, and each of the lock shim 36 is composed of an engaging piece 36a and an operation piece 36b so as to provide a bent L-shape structure, the engaging piece 36a being formed with a slit 36c which is inserted into and engaged with the engaging groove 16c of the pin 16b.

The use of the small lock shim 36 makes compact the structure of the IC socket 11 and reduce manufacturing cost.

The other structure of the IC socket of the second embodiment is substantially the same as that of the first embodiment, so that the details thereof are omitted herein.

[Third Embodiment]

Figure 14A:
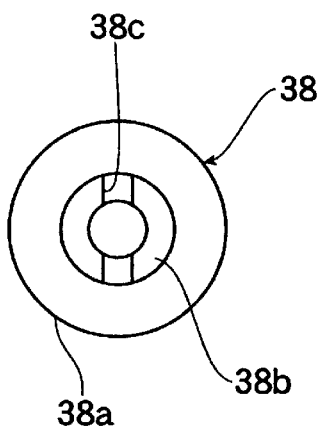
FIG. 14A is a plan view of the pin and FIG. 14B is a sectional view showing a using state thereof.
Figure 14B:
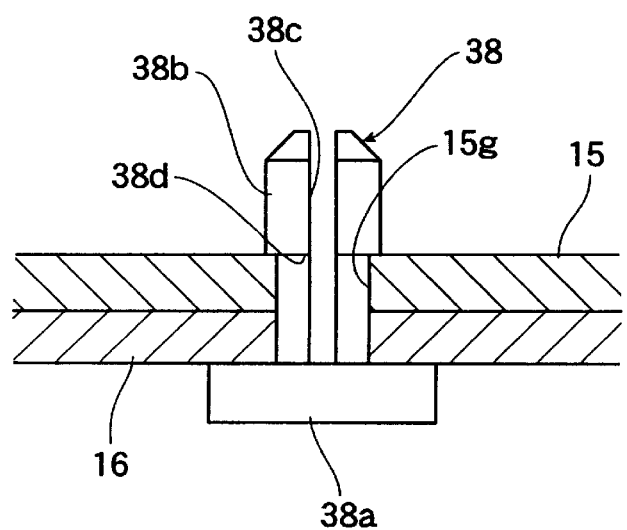

FIGS. 14A and 14B represent a third embodiment of the present invention, in which a structure of a pin 38 is different from that of the pin 16b in the first embodiment.

That is, in this third embodiment, the pin 38 is composed of a head portion 38a and a shank portion 38b. The shank portion 38b is formed with a slotted portion (slit) 38c so that the diameter of the shank portion 38b is reduced by elastically narrowing the slotted portion 38c. Furthermore, the shank portion 38b has a front end (free end) side portion having a diameter larger than that of other portion and a distal end tapered inward and is formed with a staged portion 38d, which is engageable with the peripheral edge portion of the through hole 15g of the pressure cover 15.

The pin 38 is attached to the pressure cover 15 in the following manner.

When the pin 38 is inserted into the through hole 15g of the pressure cover 15, the inward tapered distal end of the shank portion 38 slides on the peripheral edge portion of the through hole 15g, so that the shank portion 38b is reduced in diameter and, upon the completion of the insertion of the pin 38, the staged portion 38d is engaged with the peripheral edge portion of the through hole 15g, thus completing the attachment of the pin 38 to the pressure cover 15. Thus, the pin 38 can be easily engaged with the peripheral edge portion of the through hole 15g of the cover 15 only by inserting the pin 38 into the through hole 15g.

When it is required to detach the holding member 16 from the pressure cover 15, the engagement between the staged portion 38d of the pin 38 and the peripheral edge portion of the through hole 15g of the cover 15 can be easily released and by picking the front end portion of the shank portion 38b of the pin 38 and applying a force to reduce the diameter thereof, According to this manner, the pin 38 can be easily withdrawn from the through hole 15g of the pressure cover 15.

According to the structure mentioned above, it is not necessary to locate the shim 32 or shims 36 as in the first or second embodiment, whereby parts to be used can be reduced and the attaching and detaching operations can be improved.

The other structure of the IC socket of the third embodiment is substantially the same as that of the first embodiment, so that the details thereof are omitted herein.

[Fourth Embodiment]

Figure 15:
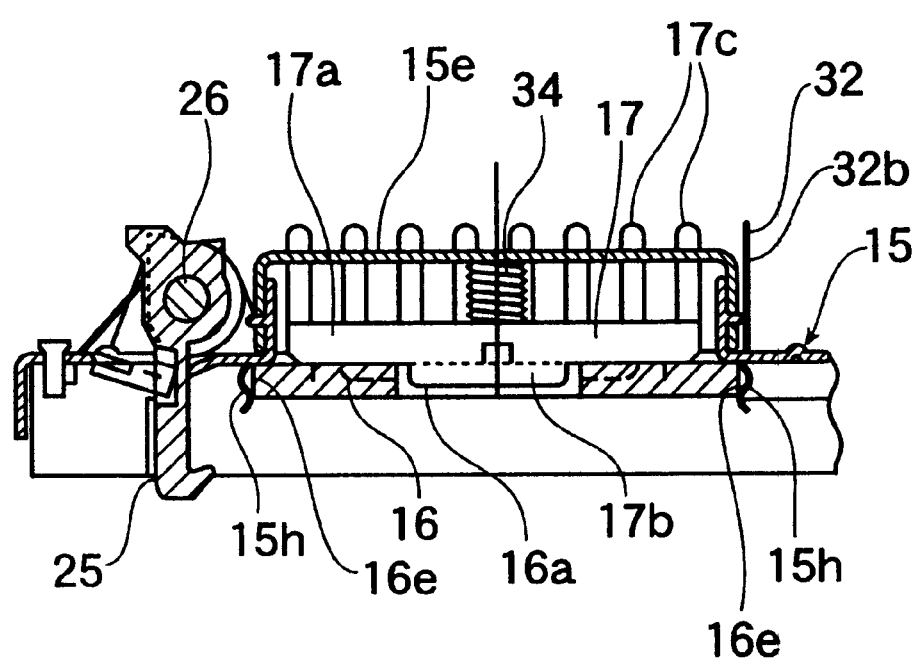
FIG. 15 is a sectional view of heat sink, heat sink receiver and holding member according to a fourth embodiment of the present invention.

FIG. 15 represents a fourth embodiment of the present invention.

In this fourth embodiment, a plurality of engaging pieces 15h, which are elastically deformable, are formed to the pressure cover 15 so as to project downward. A peripheral edge portion 16e, formed as a portion to be engaged, of the holding member 16 is engaged with these engaging pieces 15h to thereby mount the holding member 16 to the pressure cover 15.

According to this structure of the fourth embodiment, the holding member 16 can be attached to or detached from the pressure cover 15 through a one-touch operation.

It is of course possible to form an engaging piece to the holding member 16 so as to be engageable with a portion to be engaged formed to the pressure cover 15.

In the forgoing embodiments, although there is adopted the structure in which the IC package 12 is pressed by the holding member 16 which holds, together with the heat sink receiving portion 15e, the heat sink 17, a member other than the holding member 16 for pressing the IC package 12 may be additionally located.

It is also to be noted that the present invention is not limited to the embodiments described above and many other changes and modifications may be made without departing from the scopes of claims attached hereto.

What is claimed is:

1. In an IC socket in which a pressure cover is disposed so as to be opened and closed with respect to a socket body so that when the pressure cover is closed, an IC package mounted on the socket body is pressed, said pressure cover being provided with a heat sink and a heat of the IC package is radiated therefrom through a press-contact of said heat sink to the IC package, the improvement in which said pressure cover is formed with a heat sink receiver on an inner surface side to the socket body so as to receive the heat sink and a holding member is disposed on an inner surface side of the pressure cover to be detachable so as to detachably hold the heat sink between the heat sink receiver and the holding member, said holding means being provided with a pin projecting toward the pressure cover, said pressure cover is formed with a through hole through which said pin penetrate, said pin having a front end projecting over the through hole, and said projected end of the pin is fixed by a fallout prevention means formed on an outer surface side of the pressure cover, said fallout prevention means comprises lock shim means engageable with the front end of the pin, and a pair of said pins being located, each of the projected front end of said pins being formed with an engaging groove, and said lock shim means comprising a single lock shim member being composed of a pair of engaging pieces and an operation piece connecting both the engaging pieces, each of said engaging pieces being formed with a slot with which the engaging groove of said pin is engaged.

2. In an IC socket in which a pressure cover is disposed so as to be opened and closed with respect to a socket body so that when the pressure cover is closed, an IC package mounted on the socket body is pressed, said pressure cover being provided with a heat sink and a heat of the IC package is radiated therefrom through a press-contact of said heat sink to the IC package, the improvement in which said pressure cover is formed with a heat sink receiver on an inner surface side to the socket body so as to receive the heat sink and a holding member is disposed on an inner surface side of the pressure cover to be detachable so as to detachably hold the heat sink between the heat sink receiver and the holding member, said heat sink being composed of a plate member having one surface formed with a protruded portion abutting against the IC package and another surface formed with a plurality of heat radiating projections which are fitted into a plurality of holes formed to the heat sink receiver.

3. An IC socket according to claim 2, wherein a coil spring is disposed between the heat sink and the heat sink receiver so as to urge the heat sink toward the holding member.

4. An IC socket comprising:

a socket body provided with a plurality of contact pins;

an IC package mounted to the socket body and provided with a plurality of terminals to be contacted to the contact pins;

a pressure cover attached to the socket body to be rotatable so as to be opened or closed;

a heat sink mounted to the pressure cover so that when the pressure cover is rotated to be closed, a heat is radiated from the IC package when the heat sink is contacted to the IC package;

a heat sink receiver formed to an inner surface side of the socket body on the socket body side; and a holding member mounted to an inner surface side of the pressure cover to be detachably, said heat sink being held to be detachably between the heat sink receiver and the holding member, said holding means is provided with a pin projecting toward the pressure cover, said pressure cover is formed with a through hole through which said pin penetrate, said pin having a front end projecting over the through hole, and said projected end of the pin is fixed by a fallout prevention means formed on an outer surface side of the pressure cover, said fallout prevention means comprises lock shim means engageable with the front end of the pin, and a pair of said pins being located, each of the projected front end of said pins being formed with an engaging groove, and said lock shim means comprising a single lock shim member being composed of a pair of engaging pieces and an operation piece connecting both the engaging pieces, each of said engaging pieces being formed with a slot with which the engaging groove of said pin is engaged.

5. An IC socket comprising:

a socket body provided with a plurality of contact pins;

an IC package mounted to the socket body and provided with a plurality of terminals to be contacted to the contact pins;

a pressure cover attached to the socket body to be rotatable so as to be opened or closed;

a heat sink mounted to the pressure cover so that when the pressure cover is rotated to be closed, a heat is radiated from the IC package when the heat sink is contacted to the IC package;

a heat sink receiver formed to an inner surface side of the socket body on the socket body side; and a holding member mounted to an inner surface side of the pressure cover to be detachably, said heat sink being held to be detachably between the heat sink receiver and the holding member, said holding means is provided with a pin projecting toward the pressure cover, said pressure cover is formed with a through hole through which said pin penetrate, said pin having a front end projecting over the through hole, and said projected end of the pin is fixed by a fallout prevention means formed on an outer surface side of the pressure cover, and said heat sink being composed of a plate member having one surface formed with a protruded portion abutting against the IC package and another surface formed with a plurality of heat radiating projections which are fitted into a plurality of holes formed to the heat sink receiver.

6. An IC socket according to claim 5, wherein a coil spring is disposed between the heat sink and the heat sink receiver so as to urge the heat sink toward the holding member.

* * * * *